US010825807B2

United States Patent
Ren et al.

(10) Patent No.: US 10,825,807 B2
(45) Date of Patent: Nov. 3, 2020

(54) ELECTROSTATIC PROTECTION CIRCUIT, ARRAY SUBSTRATE, DISPLAY PANEL AND DISPLAY DEVICE

(71) Applicants: BOE TECHNOLOGY GROUP CO., LTD., Beijing (CN); Ordos Yuansheng Optoelectronics Co., Ltd., Inner Mongolia (CN)

(72) Inventors: Yanwei Ren, Beijing (CN); Jingyi Xu, Beijing (CN); Kunpeng Zhang, Beijing (CN); Yu Liu, Beijing (CN); Min Liu, Beijing (CN); Ruiying Tian, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 365 days.

(21) Appl. No.: 15/751,209

(22) PCT Filed: Aug. 3, 2017

(86) PCT No.: PCT/CN2017/095766
§ 371 (c)(1),
(2) Date: Feb. 8, 2018

(87) PCT Pub. No.: WO2018/126669
PCT Pub. Date: Jul. 12, 2018

(65) Prior Publication Data
US 2020/0203336 A1     Jun. 25, 2020

(30) Foreign Application Priority Data
Jan. 4, 2017 (CN) .......................... 2017 1 0005647

(51) Int. Cl.
*H01L 27/02* (2006.01)
*H01L 23/522* (2006.01)
(Continued)

(52) U.S. Cl.
CPC ........ *H01L 27/0296* (2013.01); *H01L 23/528* (2013.01); *H01L 23/5226* (2013.01);
(Continued)

(58) Field of Classification Search
CPC .............. H01L 23/5226; H01L 23/528; H01L 23/53271; H01L 27/0292; H01L 27/0296; H01L 27/124
See application file for complete search history.

(56) References Cited

U.S. PATENT DOCUMENTS 6,339,234 B1 * 1/2002 Takizawa ............ H01L 27/0251
257/203
7,843,008 B2 11/2010 Okushima
(Continued)

FOREIGN PATENT DOCUMENTS

CN    101047177 A    10/2007
CN    101345245 A    1/2009
(Continued)

OTHER PUBLICATIONS

Search Report and Written Opinion for International Application No. PCT/CN2017/095766 dated Oct. 24, 2017.

*Primary Examiner* — Allan R Wilson
(74) *Attorney, Agent, or Firm* — Calfee, Halter & Griswold LLP

(57) ABSTRACT

An electrostatic protection circuit, an array substrate, a display panel and a display device are disclosed. The electrostatic protection circuit is located within a peripheral region of an array substrate and includes: a first ground wire provided in a same layer as a source electrode and a drain
(Continued)

electrode of a thin film transistor located within a display region of the array substrate; and a second ground wire provided in a same layer as a gate electrode of the thin film transistor, wherein, the first ground wire forms a first loop with a printed circuit board provided within the peripheral region, the first loop surrounds the display region; the second ground wire forms a second loop with the printed circuit board, and the second loop surrounds the display region.

17 Claims, 10 Drawing Sheets

(51) Int. Cl.
  *H01L 23/528* (2006.01)
  *H01L 23/532* (2006.01)
  *H01L 27/12* (2006.01)
(52) U.S. Cl.
  CPC .... *H01L 23/53271* (2013.01); *H01L 27/0292* (2013.01); *H01L 27/124* (2013.01)

(56) References Cited

U.S. PATENT DOCUMENTS

| | | | |
|---|---|---|---|
| 7,999,358 B2 | 8/2011 | Bakalski et al. | |
| 8,310,010 B2 | 11/2012 | Okushima | |
| 8,513,782 B2 | 8/2013 | Bakalshi et al. | |
| 8,643,112 B2 | 2/2014 | Okushima | |
| 9,207,509 B2* | 12/2015 | Shin | G02F 1/1333 |
| 9,263,399 B2 | 2/2016 | Kaneko et al. | |
| 9,530,769 B2 | 12/2016 | Kaneko et al. | |
| 9,659,877 B2 | 5/2017 | Bakalski et al. | |
| 9,666,577 B2 | 5/2017 | Solaro et al. | |
| 9,690,152 B2 | 6/2017 | Li et al. | |
| 2007/0228476 A1 | 10/2007 | Okushima | |
| 2007/0262422 A1 | 11/2007 | Bakalski et al. | |
| 2009/0310052 A1* | 12/2009 | Huang | G02F 1/13452 349/40 |
| 2011/0049623 A1 | 3/2011 | Mallikarjunaswamy et al. | |
| 2011/0260302 A1 | 10/2011 | Bakalski et al. | |
| 2013/0062697 A1 | 3/2013 | Okushima | |
| 2013/0328178 A1 | 12/2013 | Bakalski et al. | |
| 2013/0334529 A1 | 12/2013 | Kaneko et al. | |
| 2014/0138141 A1* | 5/2014 | Li | H05K 1/0259 174/261 |
| 2015/0061023 A1 | 3/2015 | Solaro et al. | |
| 2015/0062511 A1 | 3/2015 | Shin et al. | |
| 2016/0172354 A1 | 6/2016 | Kaneko et al. | |
| 2016/0327841 A1 | 11/2016 | Jia et al. | |
| 2017/0031218 A1 | 2/2017 | Li et al. | |
| 2017/0256531 A1 | 9/2017 | Solaro et al. | |
| 2020/0075581 A1* | 3/2020 | Ren | H01L 27/124 |

FOREIGN PATENT DOCUMENTS

| | | |
|---|---|---|
| CN | 101350356 A | 1/2009 |
| CN | 103415920 A | 11/2013 |
| CN | 104423112 A | 3/2015 |
| CN | 104460070 A | 3/2015 |
| CN | 105911787 A | 8/2016 |
| CN | 106783842 A | 5/2017 |
| DE | 102006022360 A1 | 11/2007 |
| EP | 2835825 A1 | 2/2015 |
| FR | 3009432 A1 | 2/2015 |
| GB | 2517806 A | 3/2015 |
| GB | 2517806 B | 1/2016 |

* cited by examiner

ELECTROSTATIC PROTECTION CIRCUIT, ARRAY SUBSTRATE, DISPLAY PANEL AND DISPLAY DEVICE

CROSS REFERENCE

This application is based upon International Application No. PCT/CN2017/095766, filed on Aug. 3, 2017, which claims the priority of Chinese Patent Application No. 201710005647.7, filed on Jan. 4, 2017, entitled "Electrostatic Protection Circuit, Array Substrate, Display Panel and Display Device", the entire content of which is incorporated by reference herein in its entirety.

TECHNICAL FIELD

The present disclosure relates to the field of display technology, and in particular, to an electrostatic protection circuit, an array substrate, a display panel and a display device.

BACKGROUND

In the production process of a display panel, static electricity may be generated in many procedures. If the static electricity is introduced into the array substrate, the display panel may have a problem of abnormal display during an electrostatic test. Moreover, as for a structure in which a gate drive circuit is integrated into a gate on array (GOA), the static electricity may further damage the GOA circuit. If the static electricity is introduced into a color film substrate, the display panel may be reddish. Therefore, in order to avoid the damage of the display panel caused by the static electricity, an electrostatic protection circuit is usually provided in the display panel.

In a contrastive electrostatic protection circuit, as shown in FIG. 1, a ground wire 101 is provided within a peripheral region (a hatched region as shown in FIG. 1) of the array substrate 100. The ground wire 101 forms a loop with a printed circuit board 103 provided within the peripheral region of the array substrate 100 through a ground pin 102, such a loop circuit may discharge the static electricity, to achieve electrostatic protection. In fact, most of the static electricity may be discharged through a path ① as shown in FIG. 1. However, there will still be some static electricity introduced into the interior of the display panel through a path ② as shown in FIG. 1. It can be seen that, the contrastive electrostatic protection circuit has few paths to discharge the static electricity and the electrostatic discharging effect is poor.

Therefore, how to improve the electrostatic discharging capability of the electrostatic protection circuit is a technical problem to be solved by those skilled in the art.

It should be noted that, information disclosed in the above background portion is provided only for better understanding of the background of the present disclosure, and thus it may contain information that does not form the prior art known by those ordinary skilled in the art.

SUMMARY

In view of this, embodiments of the present disclosure provide an electrostatic protection circuit, an array substrate, a display panel and a display device.

Therefore, an embodiment of the present disclosure provides an electrostatic protection circuit, located within a peripheral region of an array substrate, including: a first ground wire provided in a same layer as a source electrode and a drain electrode of a thin film transistor located within a display region of the array substrate; and a second ground wire provided in a same layer as a gate electrode of the thin film transistor, wherein, the first ground wire forms a first loop with a printed circuit board provided within the peripheral region, and the first loop surrounds the display region; and the second ground wire forms a second loop with the printed circuit board, and the second loop surrounds the display region.

The first ground wire is electrically connected to the second ground wire through at least one first via hole.

In one embodiment, the above electrostatic protection circuit provided by the embodiment of the present disclosure further includes: a third ground wire provided in a same layer as an active layer in the thin film transistor, wherein the third ground wire forms a third loop with the printed circuit board, and the third loop surrounds the di splay region.

In one embodiment, the first ground wire and the second ground wire are electrically connected to each other through at least one via hole.

In one embodiment, in the above electrostatic protection circuit provided by the embodiment of the present disclosure, the first ground wire is electrically connected to the second ground wire through at least one first via hole, the third ground wire is electrically connected to the first ground wire through at least one second via hole, the third ground wire and the second ground wire are insulated from each other, the third ground wire, the second ground wire and the first ground wire are sequentially stacked over the array substrate, and the second ground wire has a third via hole penetrating through a film layer where the second ground wire is located and having an aperture larger than an aperture of the second via hole.

In one embodiment, the above electrostatic protection circuit further includes a fourth ground wire located on a side of the third ground wire away from the second ground wire, wherein the fourth ground wire is provided in a same layer as a light shielding layer, wherein the light shielding layer is located within the display region for shielding an active layer on a side of the active layer away from the gate electrode; wherein the fourth ground wire forms a fourth loop with the printed circuit board, and the fourth loop surrounds the display region.

In one embodiment, at least two of the first ground wire, the second ground wire, the third ground wire and the fourth ground wire are electrically connected to each other through at least one via hole.

In one embodiment, in the above electrostatic protection circuit provided by the embodiment of the present disclosure, a material of the third ground wire is polysilicon;

the electrostatic protection circuit further includes: a fourth ground wire located on a side of the third ground wire away from the second ground wire, and a third insulating layer between the film layer where the third ground wire is located and a film layer where the fourth ground wire is located;

the fourth ground wire is provided in a same layer as a light shielding layer, wherein the light shielding layer is located within the display region for shielding an active layer on a side of the active layer away from the gate electrode;

the fourth ground wire forms a fourth loop with the printed circuit board, and the fourth loop surrounds the display region.

In one embodiment, in the above electrostatic protection circuit provided by the embodiment of the present disclosure, the first ground wire, the third ground wire and the second ground wire are sequentially stacked over the array substrate;

the electrostatic protection circuit further includes: a fourth insulating layer between the film layer where the second ground wire is located and the film layer where the third ground wire is located, and a fifth insulating layer between the film layer where the third ground wire is located and the film layer where the first ground wire is located.

In one embodiment, in the above electrostatic protection circuit provided by the embodiment of the present disclosure, the second ground wire, the third ground wire and the first ground wire are sequentially stacked over the array substrate;

the electrostatic protection circuit further includes: a sixth insulating layer between the film layer where the first ground wire is located and the film layer where the third ground wire is located, and a seventh insulating layer between the film layer where the third ground wire is located and the film layer where the second ground wire is located.

In one embodiment, in the above electrostatic protection circuit provided by the embodiment of the present disclosure, each of the first via holes and each of the second via holes are arranged along an extending direction of the first ground wire and the second ground wire;

at least two of the first via holes are provided between two adjacent second via holes.

An embodiment of the present disclosure further provides an array substrate, including the above electrostatic protection circuits provided by embodiments of the present disclosure.

An embodiment of the present disclosure further provides a display panel, including the above array substrate provided by embodiments of the present disclosure.

An embodiment of the present disclosure further provides a display device, including the above display panel provided by embodiments of the present disclosure.

In one embodiment, at least two of the first ground wire, the second ground wire and the third ground wire are electrically connected to each other through at least one via hole.

In one embodiment, the electrostatic protection circuit further includes: a first insulating layer between a film layer where the first ground wire is located and the film layer where the second ground wire is located, and a second insulating layer between the film layer where the second ground wire is located and a film layer where the third ground wire is located; and the first via hole penetrates through the first insulating layer; and the second via hole penetrates through the first insulating layer, the third via hole in the second ground wire and the second insulating layer.

In one embodiment, the fourth ground wire is electrically connected to the second ground wire through at least one fourth via hole penetrating through the third insulating layer and the second insulating layer, and the fourth ground wire is insulated from the first ground wire and the third ground wire respectively.

In one embodiment, the first via hole penetrates through the fourth insulating layer and the fifth insulating layer, and the second via hole penetrates through the fifth insulating layer.

In one embodiment, the first via hole penetrates through the sixth insulating layer and the seventh insulating layer, and the second via hole penetrates through the sixth insulating layer.

It is to be understood that both the foregoing general description and the following detailed description are exemplary and explanatory only and are not restrictive of the invention, as claimed.

This section provides a summary of various implementations or examples of the technology described in the disclosure, and is not a comprehensive disclosure of the full scope or all features of the disclosed technology.

BRIEF DESCRIPTION OF THE DRAWINGS

FIG. 2b is a cross-sectional view taken along the direction AA of FIG. 2a;

FIG. 3b is a cross-sectional view taken along the direction B1B1 of FIG. 3a;

FIG. 3c is a cross-sectional view taken along the direction B2B2 of FIG. 3a;

FIG. 3d is a cross-sectional view taken along the direction B3B3 of FIG. 3a;

FIG. 4b is a cross-sectional view taken along the direction C1C1 of FIG. 4a;

FIG. 4c is a cross-sectional view taken along the direction C2C2 of FIG. 4a;

FIG. 5b is a cross-sectional view taken along the direction D1D1 of FIG. 5a;

FIG. 5c is a cross-sectional view taken along the direction D2D2 of FIG. 5a;

FIG. 5d is a cross-sectional view taken along the direction D3D3 of FIG. 5a;

FIG. 5e is a cross-sectional view taken along the direction D4D4 of FIG. 5a;

FIG. 6b is a cross-sectional view taken along the direction E1E1 of FIG. 6a;

FIG. 6c is a cross-sectional view taken along the direction E2E2 of FIG. 6a;

FIG. 6d is a cross-sectional view taken along the direction E3E3 of FIG. 6a; and FIG. 6e is a cross-sectional view taken along the direction E4E4 of FIG. 6a.

DETAILED DESCRIPTION

Figure 1:
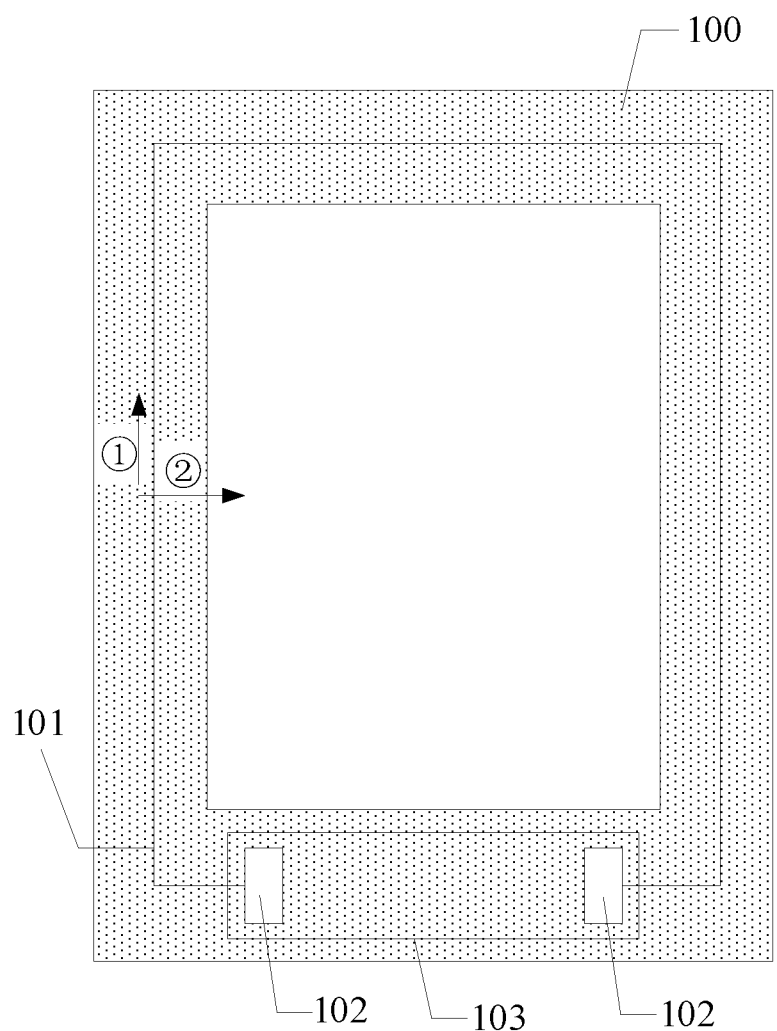
FIG. 1 is a schematic structural view of a contrastive electrostatic protection circuit.

The specific embodiments of the electrostatic protection circuit, the array substrate, the display panel and the display device provided by the embodiments of the present disclosure are described in detail below with reference to the accompanying drawings.

The shapes and thicknesses of individual layers in the drawings are not drawn to scale and are merely intended to illustrate contents of the present disclosure.

Figure 2A:
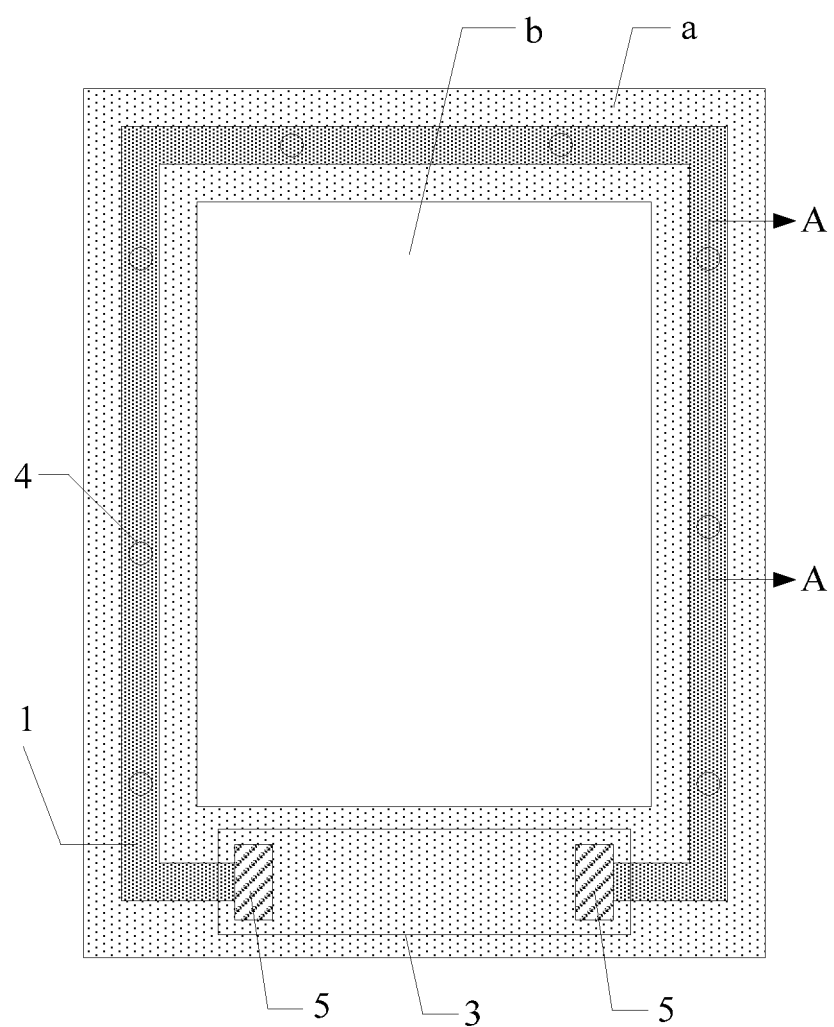
FIG. 2a is a schematic structural diagram of an electrostatic protection circuit according to an embodiment of the present disclosure.
Figure 2B:
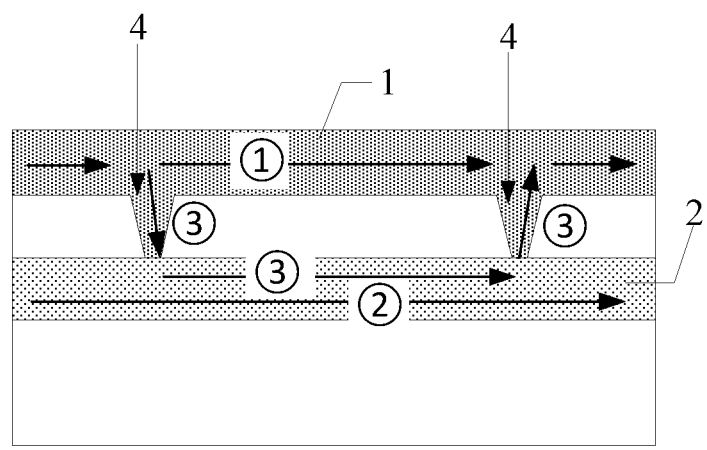

As shown in FIG. 2a and FIG. 2b which is a cross-sectional view taken along the direction AA of FIG. 2a, an electrostatic protection circuit provided by the embodiment of the present disclosure is located within a peripheral region a of an array substrate and includes: a first ground wire 1 provided in the same layer as a source electrode and a drain electrode of a thin film transistor located within a display region b (i.e., a region surrounded by the peripheral region a) of the array substrate; and a second ground wire 2 provided in the same layer as a gate electrode of the thin film transistor. In FIG. 2a and FIG. 2b, for example, the first ground wire 1 is located above the second ground wire 2, that is, the source electrode and the drain electrode of the thin film transistor are located above the gate electrode thereof.

In the embodiment, the first ground wire 1 forms a first loop with a printed circuit board 3 provided within the peripheral region a, and the first loop surrounds the display region b; and the second ground wire 2 forms a second loop with the printed circuit board 3, and the second loop surrounds the display region b.

The first ground wire 1 is electrically connected to the second ground wire 2 through at least one first via hole 4. Alternatively, of course, the first ground wire 1 may not be electrically connected to the second ground wire 2, that is, the first ground wire 1 may also be electrically insulated from the second ground wire 2.

In the above electrostatic protection circuit provided by embodiments of the present disclosure, two ground wires being the first ground wire and the second ground wire are provided. Each of the two ground wires respectively forms a loop with the printed circuit board, to discharge the static electricity, and the two ground wires are electrically connected through the first via hole. In this way, as shown in FIG. 2b, there are three paths for the electrostatic protection circuit to discharge the static electricity. That is, the static electricity is discharged through the first ground wire 1 (such as the path ① as shown in FIG. 2b), the static electricity is discharged through the second ground wire 2 (such as the path ② as shown in FIG. 2b), and the static electricity is shuttled and discharged between the first ground wire 1 and the second ground wire 2 through the first via hole 4 (such as the path ③ as shown in FIG. 2b). The electrostatic discharging capacity of the static electricity protection circuit may be increased by increasing the path of discharging the static electricity. Furthermore, the two ground wires are respectively provided in the same layer as the source electrode (drain electrode) and the gate electrode of a thin film transistor located within a display region of the array substrate, so that there is no need to additionally increase the number of masking. It is only required to add a pattern for forming a shape of the first ground wire to a region corresponding to the peripheral region in the mask plate for forming the source electrode and the drain electrode, and add a pattern for forming a shape of the second ground wire to a region corresponding to the peripheral region in the mask plate for forming the gate electrode, without increasing the manufacturing process of the array substrate.

In a specific implementation, in the above electrostatic protection circuit provided by the embodiment of the present disclosure, as shown in FIG. 2a, the first ground wire 1 may form a first loop with the printed circuit board 3 through the ground pin 5, and the second ground wire 2 may form a second loop with the printed circuit board 3 through the ground pin 5.

Optionally, the above electrostatic protection circuit provided by the embodiment of the present disclosure may further include: a third ground wire provided in the same layer as an active layer in the thin film transistor. Since the hierarchical relationship between the third ground wire and the first ground wire or the second ground wire depends on the hierarchical relationship between the active layer and the source electrode (drain electrode) or the gate electrode in the thin film transistor, i.e., depending on whether the thin film transistor is a top gate electrode structure or a bottom gate electrode structure. Therefore, in the following, the hierarchical relationship between the third ground wire and the first ground wire or the second ground wire will be described in detail in combination with the specific structure of the thin film transistor. Similarly, the third ground wire forms a third loop with the printed circuit board, and the third loop surrounds the display region. The third ground wire is electrically connected to the first ground wire through at least one second via hole, and the third ground wire and the second ground wire are insulated from each other. Since the additionally provided third ground wire is provided in the same layer as the active layer in the thin film transistor, it will not increase the number of masking additionally. It is only required to add a pattern for forming a shape of the third ground wire to a region corresponding to the peripheral region in the mask plate for forming the active layer, which will not increase the manufacturing process of the array substrate. In addition, since the gate electrode may be served as a switch after being energized to enable the active layer to be conductive, the second ground wire provided in the same layer as the gate electrode may also serve as a switch after being energized to enable the third ground wire provided in the same layer as the active layer to be conductive. The third ground wire forms a third loop with the printed circuit board, to discharge the static electricity. Besides, the third ground wire is electrically connected to the first ground wire through the second via hole. In this way, there are another two paths for the electrostatic protection circuit to discharge the static electricity. That is, the static electricity is discharged through the third ground wire, and the static electricity is conducted and discharged between the third ground wire and the first ground wire through the second via hole, thereby further increasing the number of paths to discharge the static electricity, and thus further improving the electrostatic discharging capacity of the electrostatic protection circuit.

During a specific implementation, the above electrostatic protection circuit provided by the embodiment of the present disclosure may be applied to an array substrate of a thin film transistor having a top gate electrode structure. Alternatively, the above electrostatic protection circuit provided by the embodiment of the present disclosure may be applied to an array substrate of a thin film transistor having a bottom gate electrode structure, which is not limited herein.

The specific structures of the above electrostatic protection circuits provided by the embodiments of the present disclosure are described in detail below by using the following examples.

In one example, the above electrostatic protection circuit provided by the embodiment of the present disclosure is applied to an array substrate of a thin film transistor having a top gate electrode structure. The active layer, the gate electrode and the source electrode (drain electrode) of the thin film transistor are sequentially stacked over the array substrate.

Figure 3A:
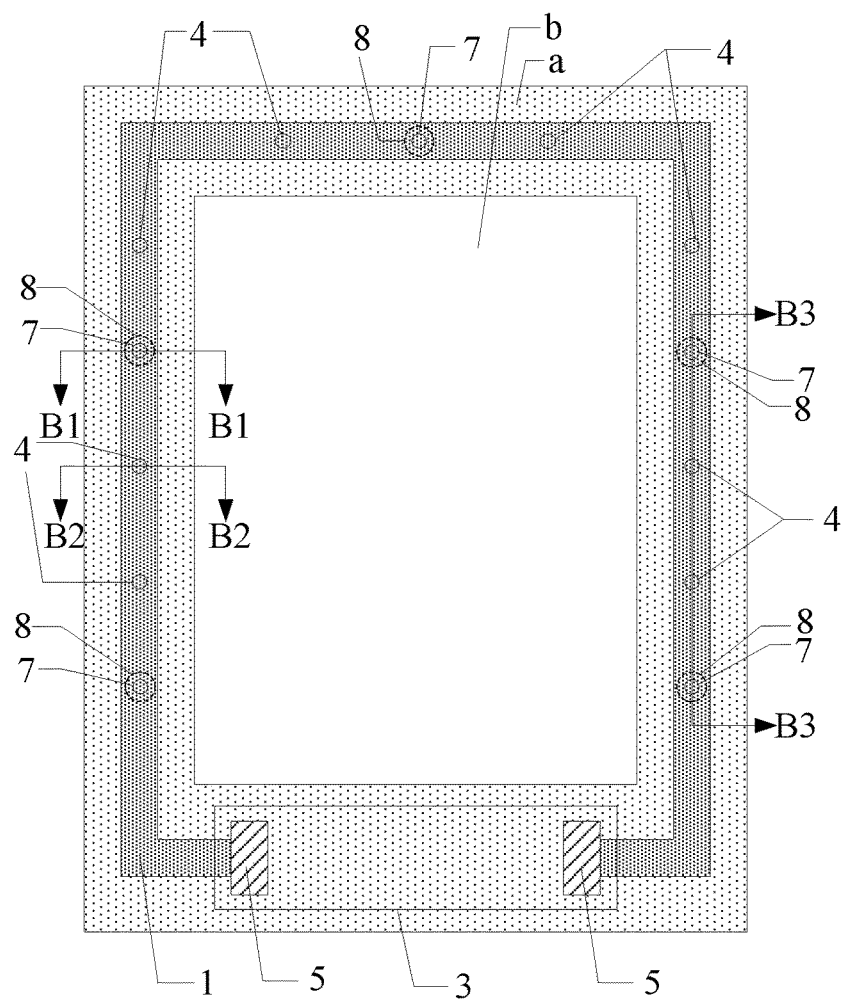
FIG. 3a is another schematic structural diagram of an electrostatic protection circuit according to an embodiment of the present disclosure.
Figure 3B:
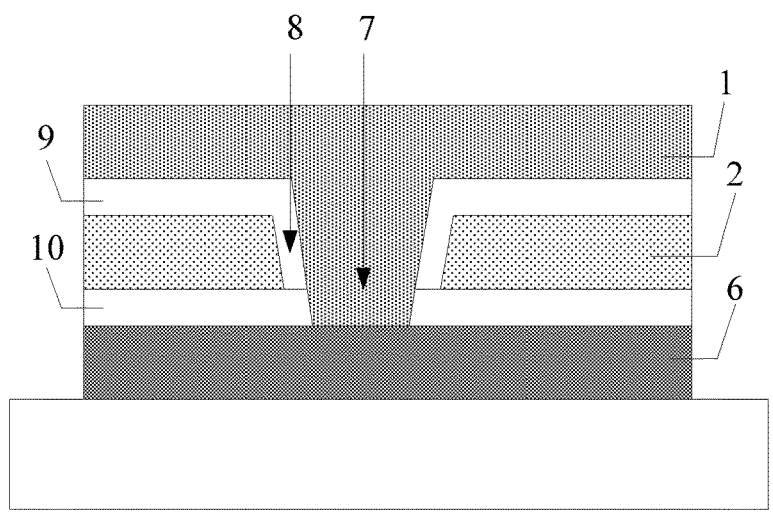
Figure 3C:
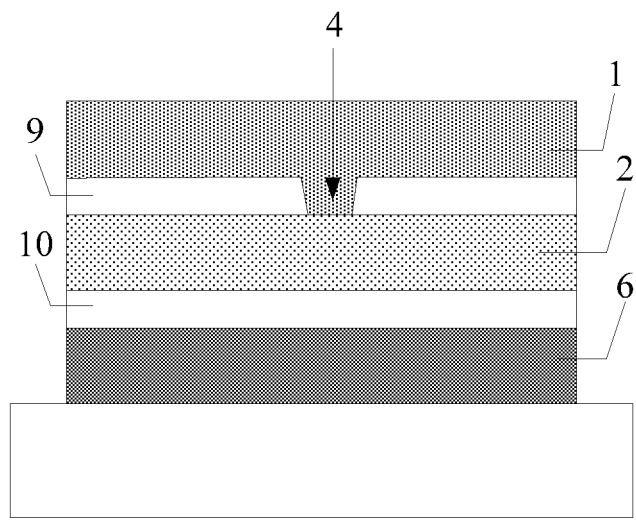
Figure 3D:
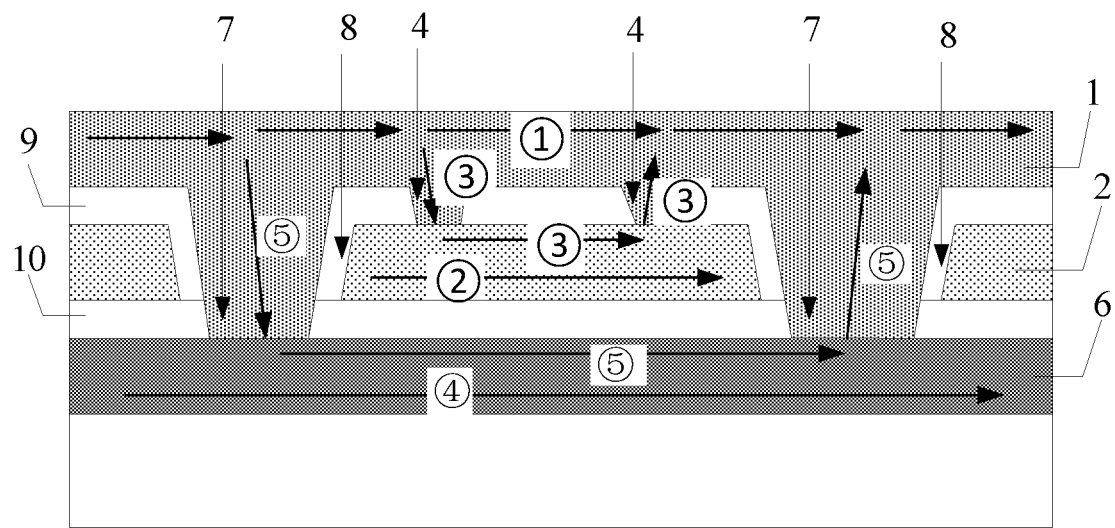

During a specific implementation, in the above electrostatic protection circuit provided by the embodiments of the present disclosure, as shown in FIGS. 3a-3c, where FIG. 3b is a cross-sectional view taken along the direction B1B1 of FIG. 3a and FIG. 3c is a cross-sectional view taken along the direction B2B2 of FIG. 3a, the third ground wire 6, the second ground wire 2 and the first ground wire 1 are sequentially stacked over the array substrate. As shown in FIG. 3b, the second ground wire 2 has a third via hole 8 penetrating through a film layer where the second ground wire 2 is located and having an aperture larger than an aperture of the second via hole 7. As shown in FIG. 3b and FIG. 3c, the above electrostatic protection circuit provided by the embodiment of the present disclosure may further include: a first insulating layer 9 between a film layer where the first ground wire 1 is located and the film layer where the second ground wire 2 is located, and a second insulating layer 10 between the film layer where the second ground wire 2 is located and a film layer where the third ground wire 6 is located. As shown in FIG. 3c, the first via hole 4 penetrates through the first insulating layer 9. As shown in FIG. 3b, the second via hole 7 penetrates through the first insulating layer 9, the third via hole 8 in the second ground wire 2 and the second insulating layer 10. The first ground wire 1 is provided in the same layer as the source electrode and the drain electrode in the thin film transistor, the second ground wire 2 is provided in the same layer as the gate electrode in the thin film transistor, and the third ground wire 6 is provided in the same layer as the active layer in the thin film transistor layer, so the second via hole 7 may be formed at the same time as the via hole in the thin film transistor for electrically connecting the active layer and the source electrode (drain electrode), and the first via hole 4 may be formed simultaneously with the formation of the second via hole 7. Therefore, through the above electrostatic protection circuit provided by the embodiments of the present disclosure, the manufacturing process of the array substrate will not be increased. Besides, as shown in FIG. 3d which is a cross-sectional view taken along the direction B3B3 of FIG. 3a, there are five paths for the electrostatic protection circuit to discharge the static electricity. That is, the static electricity is discharged through the first ground wire 1 (such as the path ① as shown in FIG. 3d), the static electricity is discharged through the second ground wire 2 (such as the path ② as shown in FIG. 3d), the static electricity is shuttled and discharged between the first ground wire 1 and the second ground wire 2 through the first via hole 4 (such as the path ③ as shown in FIG. 3d), the static electricity is discharged through the third ground wire 6 (such as the path ④ as shown in FIG. 3d), and the static electricity is shuttled and discharged between the third ground wire 6 and the first ground wire 1 through the second via hole 7 (such as the path ⑤ as shown in FIG. 3d). Compared with the contrastive electrostatic protection circuit, the number of paths for discharging the static electricity is increased, and the electrostatic discharging capacity is improved.

It should be noted that, in the above electrostatic protection circuit provided by the embodiment of the present disclosure, as shown in FIG. 3d, the second via hole 7 penetrates through the first insulating layer 9, the third via hole 8 in the second ground wire 2, the second insulating layer 10 and an upper surface of the third ground wire 6. That is, the first ground wire 1 is electrically connected to the upper surface of the third ground wire 6 through the second via hole 7. Of course, the second via hole may also penetrate through the first insulating layer, the third via hole in the second ground wire, the second insulating layer and the third ground wire. That is, the first ground wire 1 is electrically connected to a side surface of the third ground wire 6 through the second via hole, which is not limited herein. In addition, although an embodiment in which the first ground wire 1 is electrically connected to the third ground wire 6 through the via hole is described above, the present disclosure is not limited thereto. It should be understood that at least two ground wires among the first ground wire 1, the second ground wire 2, and the third ground wire 6 may be electrically connected to each other.

During a specific implementation, the above electrostatic protection circuit provided by the embodiments of the present disclosure may be applied to an array substrate of a thin film transistor having an oxide active layer. Alternatively, the above electrostatic protection circuit provided by the embodiments of the present disclosure may be applied to an array substrate of a thin film transistor having a polysilicon active layer, which is not limited herein.

In an embodiment, the above electrostatic protection circuit provided by the embodiment of the present disclosure is particularly suitable for an array substrate of a thin film transistor having a polysilicon active layer, that is, a material of the third ground wire is polysilicon. In the above electrostatic protection circuit provided by the embodiment of the present disclosure, as shown in FIG. 4a and FIG. 4b which is a cross-sectional view taken along the direction C1C1 of FIG. 4a, it may further include: a fourth ground wire 11 located on a side of the third ground wire 6 away from the second ground wire 2, and a third insulating layer 12 between the film layer where the third ground wire 6 is located and a film layer where the fourth ground wire 11 is located; the fourth ground wire 11 is provided in the same layer as a light shielding layer for shielding an active layer on a side of the active layer away from the gate electrode and located within the display region b; the light shielding layer may prevent the light emitted from a backlight module from irradiating the polysilicon active layer to affect the performance of the thin film transistor; the fourth ground wire 11 forms a fourth loop with the printed circuit board 3, and the fourth loop surrounds the display region b.

Figure 4A:
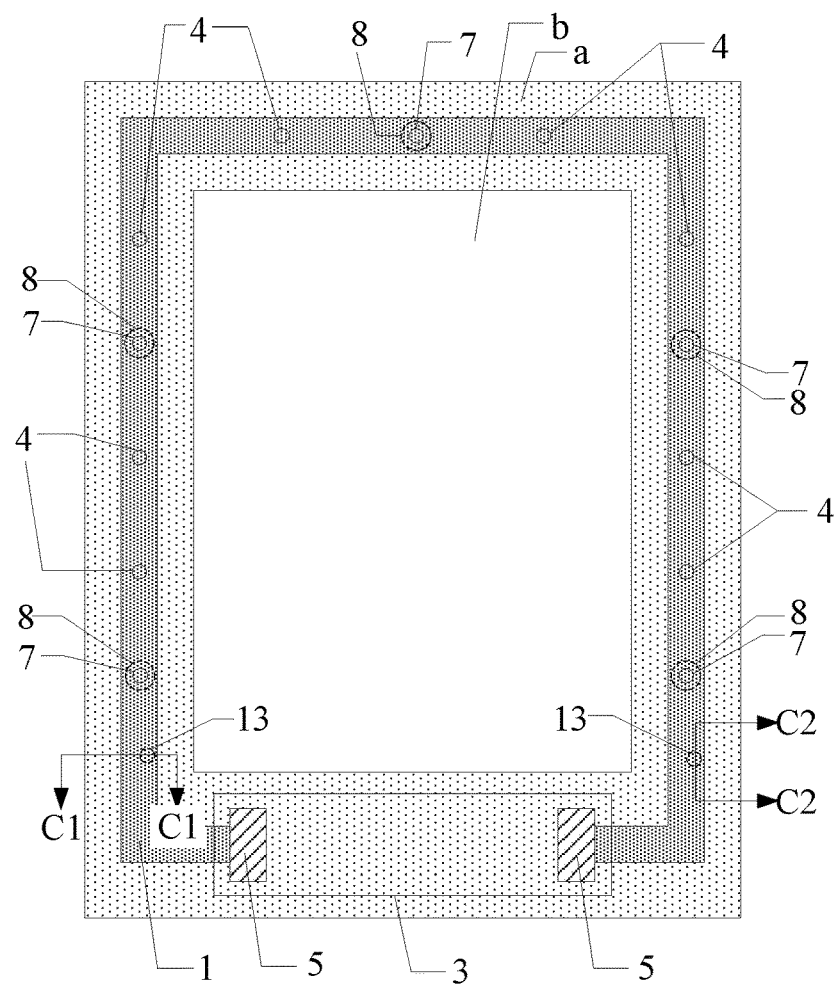
FIG. 4a is yet another schematic structural diagram of an electrostatic protection circuit according to an embodiment of the present disclosure.
Figure 4B:
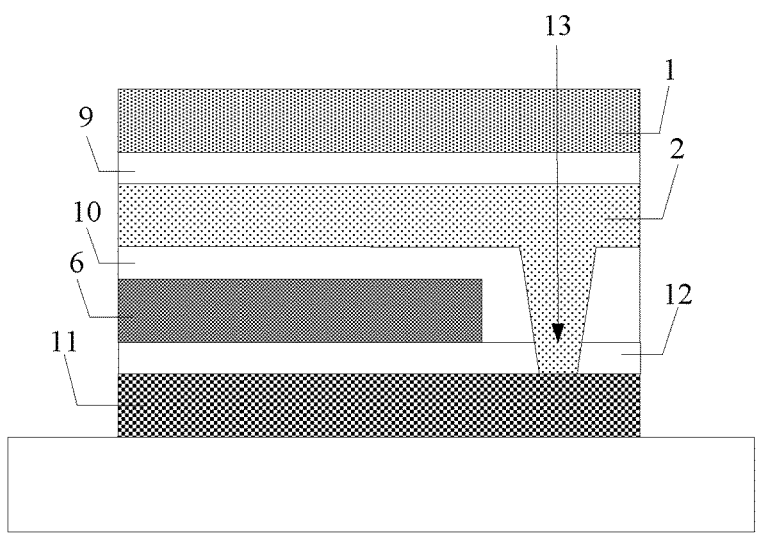
Figure 4C:
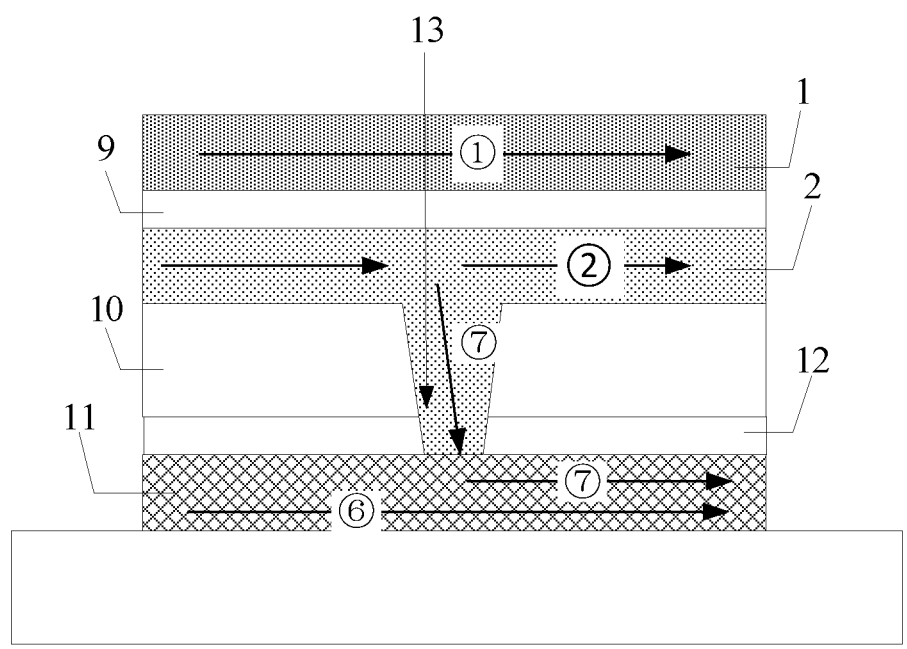

As shown in FIG. 4b, the fourth ground wire 11 is electrically connected to the second ground wire 2 through at least one fourth via hole 13 penetrating through the third insulating layer 12 and the second insulating layer 10, and the fourth ground wire 11 is insulated from the first ground wire 1 and the third ground wire 6 respectively. Since the additionally provided fourth ground wire 11 is provided in the same layer as the light shielding layer, it will not increase the number of masking additionally. It is only required to add a pattern for forming a shape of the fourth ground wire 11 to a region corresponding to the peripheral region a in the mask plate for forming the light shielding layer, which will not increase the manufacturing process of the array substrate. The light shielding layer is generally not made of the same material as a black matrix, but made of a metal material resistant to the high temperature. The fourth ground wire 11 may form a fourth loop with the printed circuit board 3, to discharge the static electricity, and the fourth ground wire 11 is electrically connected to the second ground wire 2 through the fourth via hole 13. In this way, as shown in FIG. 4c which is a cross-sectional view taken along the direction C2C2 of FIG. 4a, there will be another two paths for the electrostatic protection circuit to discharge the static electricity. That is, the static electricity is discharged through the fourth ground wire 11 (such as the path ⑥ as shown in FIG. 4c), and the static electricity is shuttled and discharged between the fourth ground wire 11 and the second ground wire 2 through the fourth via hole 13 (such as the path ⑦ as shown in FIG. 4c). Thus, the number of paths for discharging the static electricity may be further increased, and the electrostatic discharging capacity of the electrostatic protection circuit may be further improved.

In addition, although an embodiment in which the fourth ground wire 11 is electrically connected to the second ground wire 2 through the via hole is described above, the present disclosure is not limited thereto. It should be understood that at least two ground wires among the first ground wire 1, the second ground wire 2, the third ground wire 6 and the fourth ground wire 11 may be electrically connected to each other.

In one embodiment, in the above electrostatic protection circuit provided by the embodiment of the present disclosure, as shown in FIG. 3a and FIG. 4a, each of the first via holes 4 and each of the second via holes 7 are arranged along an extending direction of the first ground wire 1 and the second ground wire 2; and at least two of the first via holes 4 are provided between two adjacent second via holes 7. In this way, the number of paths for discharging the static electricity may be further increased, and the electrostatic discharging capacity of the electrostatic protection circuit may be further improved. In fact, the more the number of the first via hole and the second via hole provided in the electrostatic protection circuit is, the more the path for discharging the static electricity will be, but the actual manufacturing process will be more difficult. Therefore, an appropriate amount of the first via hole and the second via hole may be provided as desired.

In another example, the above electrostatic protection circuit provided by the embodiment of the present disclosure is applied to an array substrate of a thin film transistor having a top gate electrode structure. The source electrode (drain electrode), the active layer and the gate electrode of the thin film transistor are sequentially stacked over the array substrate.

Figure 5A:
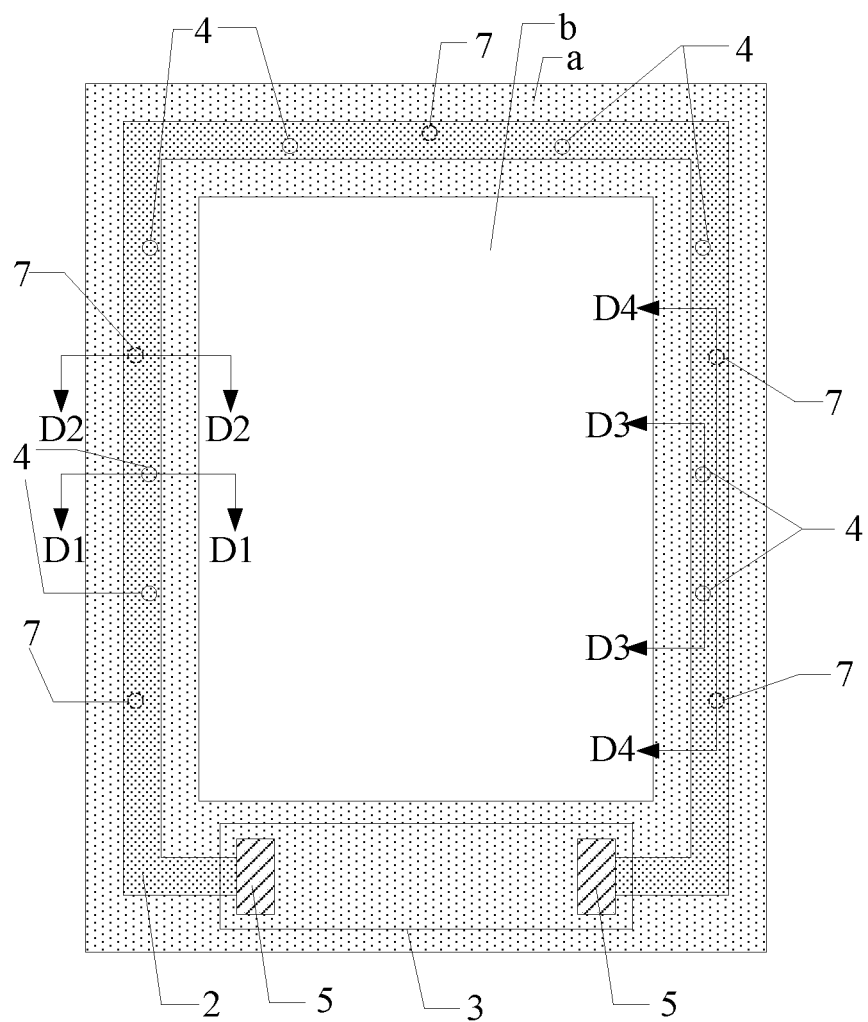
FIG. 5a is still another schematic structural diagram of an electrostatic protection circuit according to an embodiment of the present disclosure.
Figure 5B:
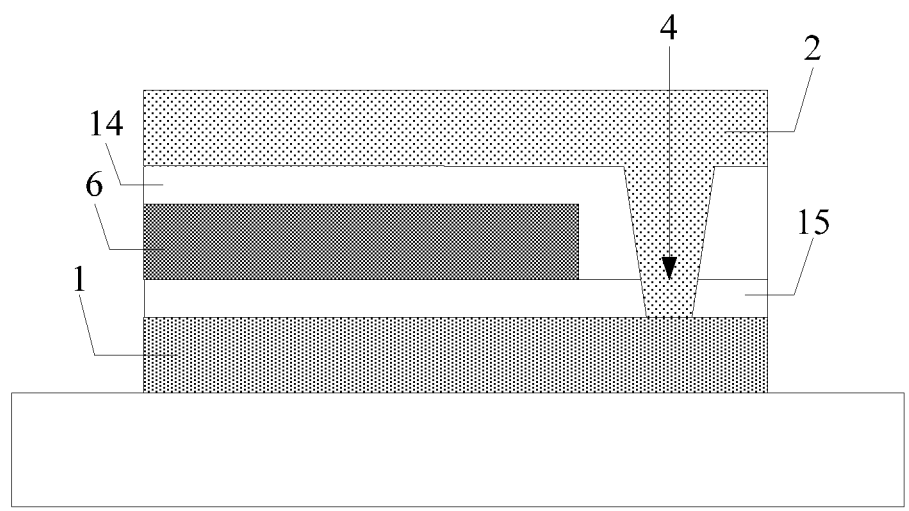
Figure 5C:
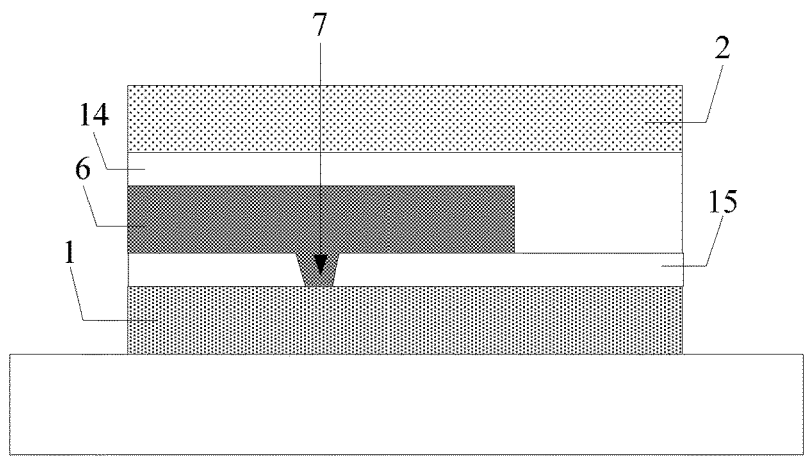
Figure 5D:
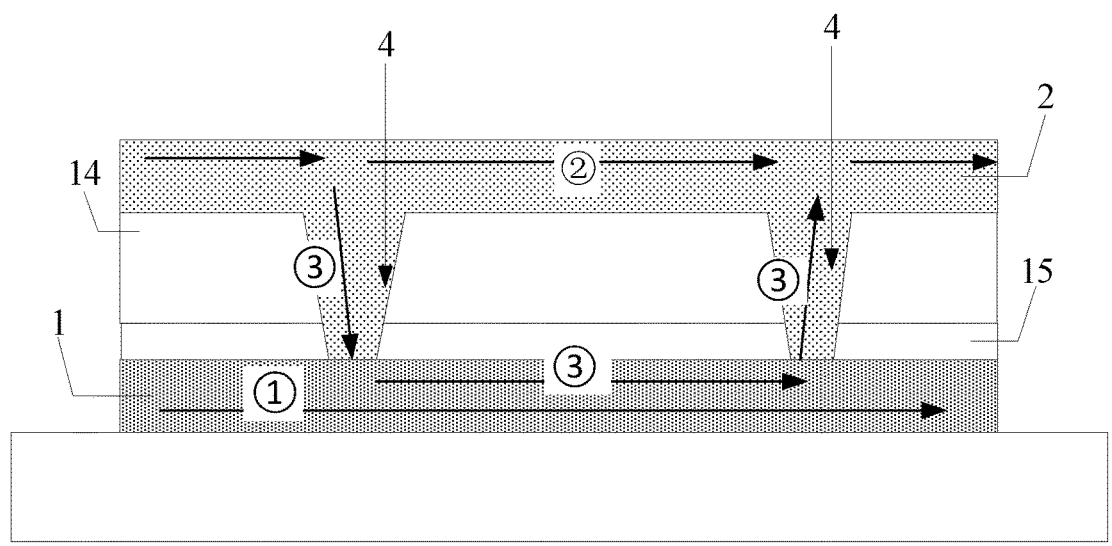
Figure 5E:
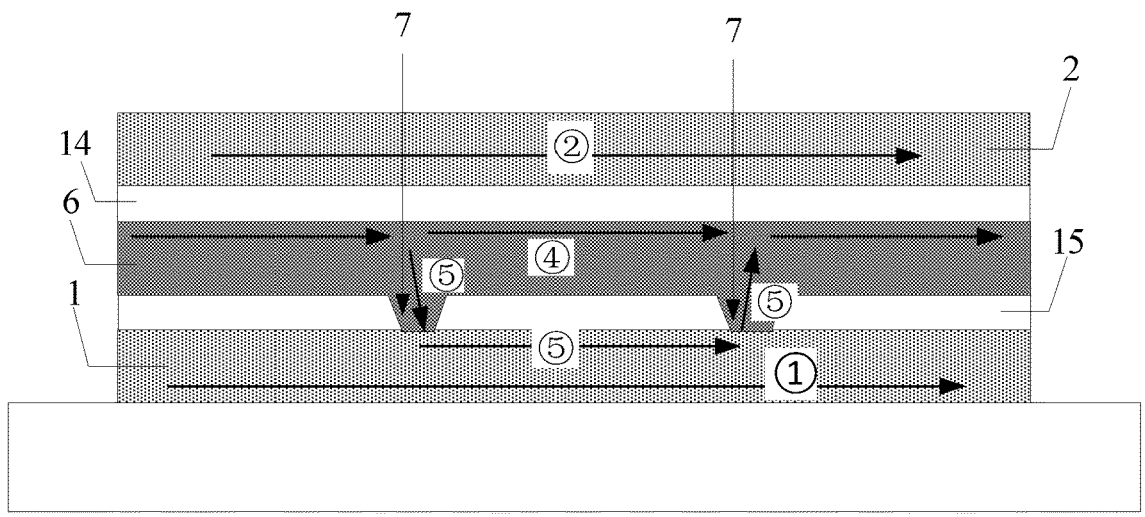

During a specific implementation, in the above electrostatic protection circuit provided by the embodiments of the present disclosure, as shown in FIGS. 5a-5c, where FIG. 5b is a cross-sectional view taken along the direction D1D1 of FIG. 5a and FIG. 5c is a cross-sectional view taken along the direction D2D2 of FIG. 5a, the first ground wire 1, the third ground wire 6 and the second ground wire 2 are sequentially stacked over the array substrate. As shown in FIG. 5b and FIG. 5c, the above electrostatic protection circuit provided by the embodiment of the present disclosure may further include: a fourth insulating layer 14 between a film layer where the second ground wire 2 is located and the film layer where the third ground wire 6 is located, and a fifth insulating layer 15 between the film layer where the third ground wire 6 is located and a film layer where the first ground wire 1 is located. As shown in FIG. 5b, the first via hole 4 penetrates through the fourth insulating layer 14 and the fifth insulating layer 15. As shown in FIG. 5c, the second via hole 7 penetrates through the fifth insulating layer 15. As shown in FIG. 5d and FIG. 5e where FIG. 5d is a cross-sectional view taken along the direction D3D3 of FIG. 5a and FIG. 5e is a cross-sectional view taken along the direction D4D4 of FIG. 5a, there are five paths for the electrostatic protection circuit to discharge the static electricity. That is, the static electricity is discharged through the first ground wire 1 (such as the path ① as shown in FIG. 5d and FIG. 5e), the static electricity is discharged through the second ground wire 2 (such as the path ② as shown in FIG. 5d and FIG. 5e), the static electricity is shuttled and discharged between the first ground wire 1 and the second ground wire 2 through the first via hole 4 (such as the path ③ as shown in FIG. 5d), the static electricity is discharged through the third ground wire 6 (such as the path ④ as shown in FIG. 5e), and the static electricity is shuttled and discharged between the third ground wire 6 and the first ground wire 1 through the second via hole 7 (such as the path ⑤ as shown in FIG. 5e). Compared with the contrastive electrostatic protection circuit, the number of paths for discharging the static electricity is increased, and the electrostatic discharging capacity is improved.

In one embodiment, in the above electrostatic protection circuit provided by the embodiment of the present disclosure, as shown in FIG. 5a, each of the first via holes 4 and each of the second via holes 7 are arranged along an extending direction of the first ground wire 1 and the second ground wire 2; and at least two of the first via holes 4 are provided between two adjacent second via holes 7. In this way, the number of paths for discharging the static electricity may be further increased, and the electrostatic discharging capacity of the electrostatic protection circuit may be further improved. In fact, the more the number of the first via hole and the second via hole provided in the electrostatic protection circuit is, the more the path for discharging the static electricity will be, but the actual manufacturing process will be more difficult. Therefore, an appropriate amount of the first via hole and the second via hole may be provided as desired.

In another example, the above electrostatic protection circuit provided by the embodiment of the present disclosure is applied to an array substrate of a thin film transistor having a bottom gate electrode structure. The gate electrode, the active layer and the source electrode (drain electrode) of the thin film transistor are sequentially stacked over the array substrate.

Figure 6A:
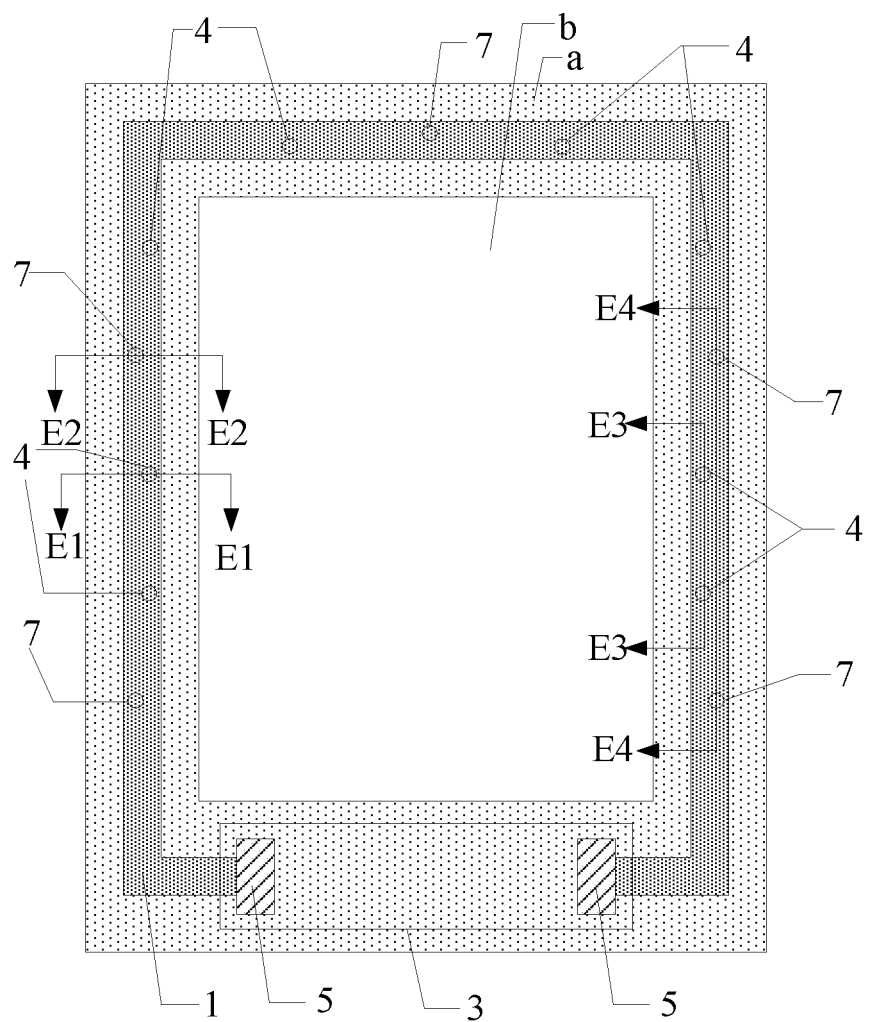
FIG. 6a is still yet another schematic structural diagram of an electrostatic protection circuit according to an embodiment of the present disclosure.
Figure 6B:
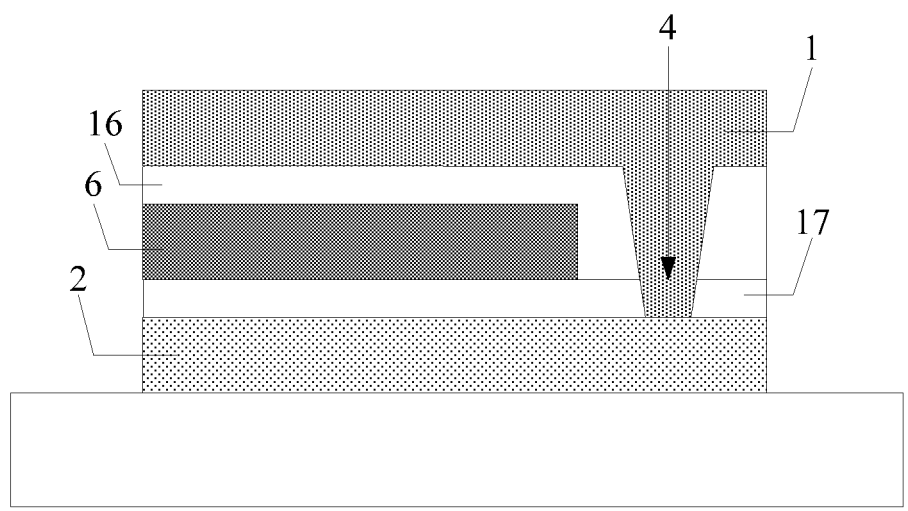
Figure 6C:
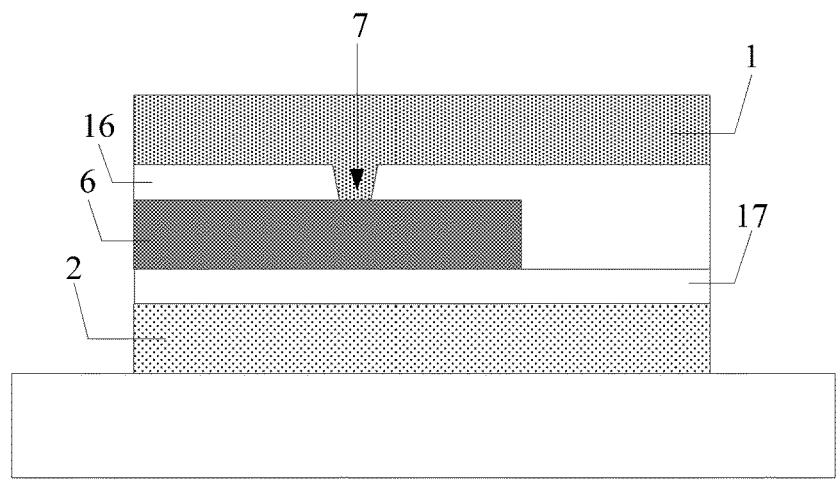
Figure 6D:
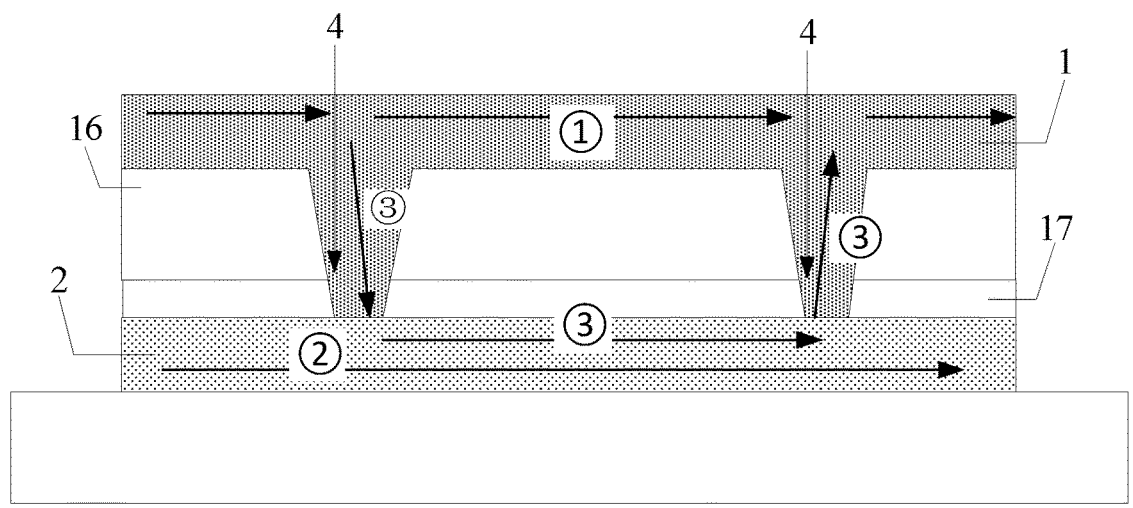
Figure 6E:
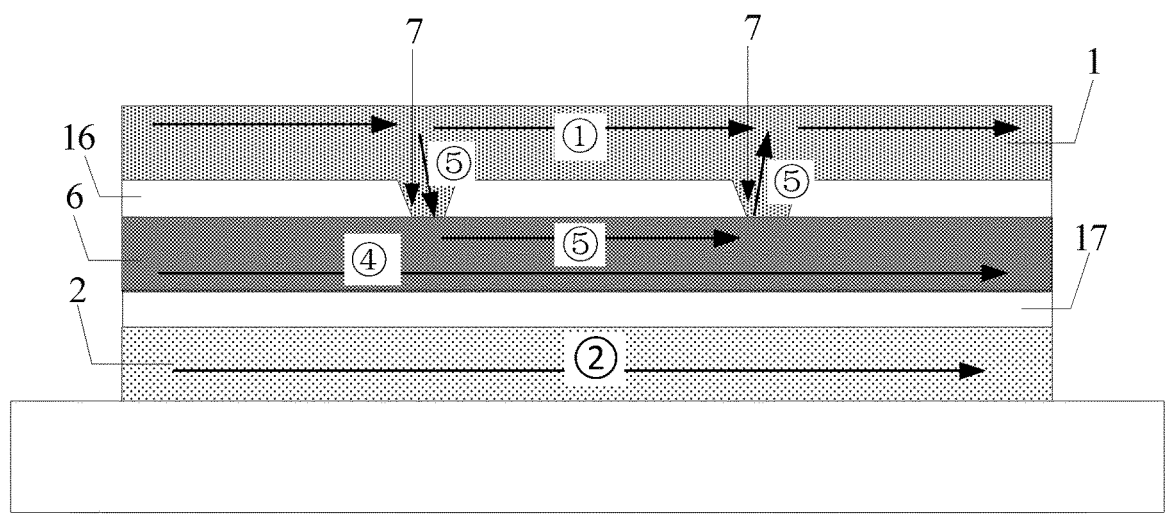

During a specific implementation, in the above electrostatic protection circuit provided by the embodiments of the present disclosure, as shown in FIGS. 6a-6c, where FIG. 6b is a cross-sectional view taken along the direction E1E1 of FIG. 6a and FIG. 6c is a cross-sectional view taken along the direction E2E2 of FIG. 6a, the second ground wire 2, the third ground wire 6 and the first ground wire 1 are sequentially stacked over the array substrate. As shown in FIG. 6b and FIG. 6c, the above electrostatic protection circuit provided by the embodiment of the present disclosure may further include: a sixth insulating layer 16 between a film layer where the first ground wire 1 is located and the film layer where the third ground wire 6 is located, and a seventh insulating layer 17 between the film layer where the third ground wire 6 is located and a film layer where the second ground wire 2 is located. As shown in FIG. 6b, the first via hole 4 penetrates through the sixth insulating layer 16 and the seventh insulating layer 17. As shown in FIG. 6c, the second via hole 7 penetrates through the sixth insulating layer 16. The first ground wire 1 is provided in the same layer as the source electrode and the drain electrode in the thin film transistor, the second ground wire 2 is provided in the same layer as the gate electrode in the thin film transistor, and the third ground wire 6 is provided in the same layer as the active layer in the thin film transistor layer, so the second via hole 7 may be formed at the same time as the via hole in the thin film transistor for electrically connecting the active layer and the source electrode (drain electrode), and the first via hole 4 may be formed simultaneously with the formation of the second via hole 7. Therefore, through the above electrostatic protection circuit provided by the embodiments of the present disclosure, the manufacturing process of the array substrate will not be increased. Besides, as shown in FIG. 6d which is a cross-sectional view taken along the direction E3E3 of FIG. 6a and FIG. 6e which is a cross-sectional view taken along the direction E4E4 of FIG. 6a, there are five paths for the electrostatic protection circuit to discharge the static electricity. That is, the static electricity is discharged through the first ground wire 1 (such as the path ① as shown in FIG. 6d and FIG. 6e), the static electricity is discharged through the second ground wire 2 (such as the path ② as shown in FIG. 6d and FIG. 6e), the static electricity is shuttled and discharged between the first ground wire 1 and the second ground wire 2 through the first via hole 4 (such as the path ③ as shown in FIG. 6d), the static electricity is discharged through the third ground wire 6 (such as the path ④ as shown in FIG. 6e), and the static electricity is shuttled and discharged between the third ground wire 6 and the first ground wire 1 through the second via hole 7 (such as the path ⑤ as shown in FIG. 6e). Compared with the contrastive electrostatic protection circuit, the number of paths for discharging the static electricity is increased, and the electrostatic discharging capacity is improved.

In one embodiment, in the above electrostatic protection circuit provided by the embodiment of the present disclosure, as shown in FIG. 6a, each of the first via holes 4 and each of the second via holes 7 are arranged along an extending direction of the first ground wire 1 and the second ground wire 2; and at least two of the first via holes 4 are provided between two adjacent second via holes 7. In this way, the number of paths for discharging the static electricity may be further increased, and the electrostatic discharging capacity of the electrostatic protection circuit may be further improved. In fact, the more the number of the first via hole and the second via hole provided in the electrostatic protection circuit is, the more the path for discharging the static electricity will be, but the actual manufacturing process will be more difficult. Therefore, an appropriate amount of the first via hole and the second via hole may be provided as desired.

Based on the same inventive concept, embodiments of the present disclosure further provide an array substrate including the above electrostatic protection circuits provided by embodiments of the present disclosure. The implementation of the array substrate may refer to the embodiment of the electrostatic protection circuit described above, and details are not described herein again.

Based on the same inventive concept, embodiments of the present disclosure further provide a display panel including the above array substrate provided by the embodiments of the present disclosure. The implementation of the display panel may refer to the embodiment of the array substrate described above, and details are not described herein again.

Based on the same inventive concept, embodiments of the present disclosure further provide a display device including the above display panel provided by the embodiments of the present disclosure. The display device may be: a mobile phone, a tablet computer, a television set, a display, a notebook computer, a digital photo frame, a navigator and any other products or components having a display function. The implementation of the display device may refer to the embodiment of the display panel described above, and details are not described herein again.

In the above electrostatic protection circuit, array substrate, display panel and display device provided by embodiments of the present disclosure, two ground wires being the first ground wire and the second ground wire are provided in the electrostatic protection circuit. Each of the two ground wires respectively forms a loop with the printed circuit board, to discharge the static electricity, and the two ground wires are electrically connected through the first via hole. In this way, there are three paths for the electrostatic protection circuit to discharge the static electricity. That is, the static electricity is discharged through the first ground wire, the static electricity is discharged through the second ground wire, and the static electricity is shuttled and discharged between the first ground wire and the second ground wire through the first via hole. The electrostatic discharging capacity of the static electricity protection circuit may be increased by increasing the path of discharging the static electricity. Furthermore, the two ground wires are respectively provided in the same layer as the source/drain electrode and the gate electrode of a thin film transistor located within a display region of the array substrate, so that the manufacturing process of the array substrate will not be increased.

Obviously, those skilled in the art may make various modifications and variations to the present disclosure without departing from the spirit and scope of the present disclosure. In this way, if these modifications and variations of the present disclosure fall within the scope of the claims of the present disclosure and the equivalent technologies thereof, the present disclosure is also intended to include these modifications and variations.

What is claimed is:

1. An electrostatic protection circuit, located within a peripheral region of an array substrate, comprising: a first ground wire provided in a same layer as a source electrode and a drain electrode of a thin film transistor located within a display region of the array substrate; and a second ground wire provided in a same layer as a gate electrode of the thin film transistor, wherein,
the first ground wire forms a first loop with a printed circuit board provided within the peripheral region, and the first loop surrounds the display region; and the second ground wire forms a second loop with the printed circuit board, and the second loop surrounds the display region, and
wherein the electrostatic protection circuit further comprises: a third ground wire provided in a same layer as an active layer in the thin film transistor, wherein
the third ground wire forms a third loop with the printed circuit board, and the third loop surrounds the display region.

2. The electrostatic protection circuit according to claim 1, wherein the first ground wire and the second ground wire are electrically connected to each other through at least one via hole.

3. The electrostatic protection circuit according to claim 1, wherein the first ground wire is electrically connected to the second ground wire through at least one first via hole, the third ground wire is electrically connected to the first ground wire through at least one second via hole, the third ground wire and the second ground wire are insulated from each other, the third ground wire, the second ground wire and the first ground wire are sequentially stacked over the array substrate, and the second ground wire has a third via hole penetrating through a film layer where the second ground wire is located and having an aperture larger than an aperture of the second via hole.

4. The electrostatic protection circuit according to claim 1, further comprising a fourth ground wire located on a side of the third ground wire away from the second ground wire, wherein the fourth ground wire is provided in a same layer as a light shielding layer, wherein the light shielding layer is located within the display region for shielding an active layer on a side of the active layer away from the gate electrode;
  wherein the fourth ground wire forms a fourth loop with the printed circuit board, and the fourth loop surrounds the display region.

5. The electrostatic protection circuit according to claim 4, wherein at least two of the first ground wire, the second ground wire, the third ground wire and the fourth ground wire are electrically connected to each other through at least one via hole.

6. The electrostatic protection circuit according to claim 3, wherein a material of the third ground wire is polysilicon;
  the electrostatic protection circuit further comprises: a fourth ground wire located on a side of the third ground wire away from the second ground wire, and a third insulating layer between the film layer where the third ground wire is located and a film layer where the fourth ground wire is located;
  the fourth ground wire is provided in a same layer as a light shielding layer, wherein the light shielding layer is located within the display region for shielding an active layer on a side of the active layer away from the gate electrode;
  the fourth ground wire forms a fourth loop with the printed circuit board, and the fourth loop surrounds the display region.

7. The electrostatic protection circuit according to claim 3, wherein the first ground wire, the third ground wire and the second ground wire are sequentially stacked over the array substrate;
  the electrostatic protection circuit further comprises: a fourth insulating layer between the film layer where the second ground wire is located and the film layer where the third ground wire is located, and a fifth insulating layer between the film layer where the third ground wire is located and the film layer where the first ground wire is located.

8. The electrostatic protection circuit according to claim 3, wherein the second ground wire, the third ground wire and the first ground wire are sequentially stacked over the array substrate;
  the electrostatic protection circuit further comprises: a sixth insulating layer between the film layer where the first ground wire is located and the film layer where the third ground wire is located, and a seventh insulating layer between the film layer where the third ground wire is located and the film layer where the second ground wire is located.

9. The electrostatic protection circuit according to claim 3, wherein each of the first via holes and each of the second via holes are arranged along an extending direction of the first ground wire and the second ground wire;
  at least two of the first via holes are provided between two adjacent second via holes.

10. An array substrate, comprising the electrostatic protection circuit according to claim 1.

11. A display panel, comprising the array substrate according to claim 10.

12. A display device, comprising the display panel according to claim 11.

13. The electrostatic protection circuit according to claim 1, wherein at least two of the first ground wire, the second ground wire and the third ground wire are electrically connected to each other through at least one via hole.

14. The electrostatic protection circuit according to claim 3, wherein the electrostatic protection circuit further comprises: a first insulating layer between a film layer where the first ground wire is located and the film layer where the second ground wire is located, and a second insulating layer between the film layer where the second ground wire is located and a film layer where the third ground wire is located; and
  the first via hole penetrates through the first insulating layer; and the second via hole penetrates through the first insulating layer, the third via hole in the second ground wire and the second insulating layer.

15. The electrostatic protection circuit according to claim 6, wherein the fourth ground wire is electrically connected to the second ground wire through at least one fourth via hole penetrating through the third insulating layer and the second insulating layer, and the fourth ground wire is insulated from the first ground wire and the third ground wire respectively.

16. The electrostatic protection circuit according to claim 7, wherein the first via hole penetrates through the fourth insulating layer and the fifth insulating layer, and the second via hole penetrates through the fifth insulating layer.

17. The electrostatic protection circuit according to claim 8, wherein the first via hole penetrates through the sixth insulating layer and the seventh insulating layer, and the second via hole penetrates through the sixth insulating layer.

* * * * *